US011027366B2

(12) United States Patent
Emery et al.

(10) Patent No.: US 11,027,366 B2
(45) Date of Patent: Jun. 8, 2021

(54) LASER POWER DISTRIBUTION MODULE

(71) Applicant: nLIGHT, Inc., Vancouver, WA (US)

(72) Inventors: Joseph J. Emery, Vancouver, WA (US); Jeremy Young, Vancouver, WA (US); Shelly Lin, Vancouver, WA (US); Ken Almonte, Vancouver, WA (US); Nathaniel Black, Vancouver, WA (US)

(73) Assignee: NLIGHT, INC., Vancouver, WA (US)

( * ) Notice: Subject to any disclaimer, the term of this patent is extended or adjusted under 35 U.S.C. 154(b) by 431 days.

(21) Appl. No.: 15/687,047

(22) Filed: Aug. 25, 2017

(65) Prior Publication Data
US 2018/0056442 A1 Mar. 1, 2018

Related U.S. Application Data

(60) Provisional application No. 62/380,258, filed on Aug. 26, 2016.

(51) Int. Cl.
B23K 26/06 (2014.01)
H01S 5/40 (2006.01)
H01S 5/042 (2006.01)

(52) U.S. Cl.
CPC .......... B23K 26/0604 (2013.01); H01S 5/042 (2013.01); H01S 5/4012 (2013.01)

(58) Field of Classification Search
CPC .............................. B23K 26/70; B23K 26/0604
(Continued)

(56) References Cited

U.S. PATENT DOCUMENTS 4,885,436 A 12/1989 Pham et al.
5,010,426 A * 4/1991 Krenz .................. G11B 25/043
360/137

(Continued)

FOREIGN PATENT DOCUMENTS

CN 202308826 7/2012
CN 103582976 2/2014
(Continued)

OTHER PUBLICATIONS

International Search Report and Written Opinion for International Patent Application No. PCT/US17/48673, dated Nov. 8, 2017.
(Continued)

Primary Examiner — Christopher M Koehler
Assistant Examiner — Spencer H. Kirkwood
(74) Attorney, Agent, or Firm — Green, Howard & Mughal LLP

(57) ABSTRACT

A laser system including a rack, a plurality of laser modules mounted in the rack to drive light through an optical fiber exiting the system, and a power distribution module to distribute electricity through circuit branches coupled to the laser modules is generally presented. In some embodiments, the rack includes a horizontal cross-member with a bottom rack flange extending vertically and defining a bottom of an opening in the rack. In some embodiments, the power distribution module includes an enclosure disposed in the rack opening, a face of the enclosure including a bottom lip to engage an edge of the bottom rack flange as a fulcrum point over a range to allow the enclosure to pivot between first and second pivot angles relative to the rack, one or more rails mounted within the enclosure, and one or more circuit components associated with each circuit branch disposed within the enclosure, each of the components including a rail-mount by which the component is affixed to the one or
(Continued)

more rails, and a plurality of electrical cables coupling the power distribution module to the laser modules. In some embodiments, the one or more rails comprise a first and second rail bifurcating an interior volume of the enclosure into front and back volumes, and the one or more components further comprise a first component mounted to the first rail and occupying a portion of the front volume and a second component mounted to the second rail and occupying a portion the back volume. Other embodiments are also disclosed and claimed.

18 Claims, 10 Drawing Sheets

(58) Field of Classification Search
USPC .......................................... 219/121.6–121.86
See application file for complete search history.

(56) References Cited

U.S. PATENT DOCUMENTS

| | | | | |
|---|---|---|---|---|
| 5,863,017 | A | * | 1/1999 | Larson ..................... G02B 7/00 |
| | | | | 248/176.1 |
| 6,128,323 | A | | 10/2000 | Myers et al. |
| 7,759,574 | B2 | | 7/2010 | Berse |
| 9,152,170 | B2 | | 10/2015 | Zhu |
| 10,143,093 | B2 | | 11/2018 | Kim et al. |
| 2002/0021728 | A1 | | 2/2002 | Newman et al. |
| 2002/0126274 | A1 | | 9/2002 | Minneman et al. |
| 2002/0186666 | A1 | * | 12/2002 | Hassel ..................... B01J 4/008 |
| | | | | 370/257 |
| 2007/0086720 | A1 | * | 4/2007 | Morris ................. G02B 6/4201 |
| | | | | 385/134 |
| 2009/0323258 | A1 | | 12/2009 | Ziegler et al. |
| 2014/0185194 | A1 | | 7/2014 | Mills et al. |
| 2015/0214700 | A1 | | 7/2015 | Bergeron et al. |
| 2015/0349481 | A1 | | 12/2015 | Kliner |

FOREIGN PATENT DOCUMENTS

| | | |
|---|---|---|
| CN | 103650654 | 3/2014 |
| CN | 203522508 | 4/2014 |
| CN | 104423491 | 3/2015 |
| CN | 105849995 | 8/2016 |
| JP | 57199286 | 12/1982 |
| JP | 2824087 | 11/1998 |
| JP | 5879425 | 6/2016 |
| WO | 2012153141 | 11/2012 |
| WO | 2016060933 | 4/2016 |

OTHER PUBLICATIONS

International Preliminary Report on Patentability for PCT Application No. PCT/US17/48673, dated Mar. 7, 2019.
Extended European Search Report for EP Patent Application No. 17844509.4, dated Mar. 12, 2020.
Office Action for Chinese Patent Application No. 201780064434.X dated Mar. 26, 2020.
Office Action for Chinese Patent Application No. 201780064434.X, dated Apr. 1, 2021.

* cited by examiner

LASER POWER DISTRIBUTION MODULE

CLAIM OF PRIORITY

The present application claims priority to U.S. Provisional Patent Application No. 62/380,258 filed on Aug. 26, 2016, and entitled "LASER POWER DISTRIBUTION MODULE", which is incorporated by reference in its entirety.

BACKGROUND

Lasers are commonly used in materials processing, including cutting, welding, brazing, surface treatment and other applications. The power needs of a high power laser system can exceed that of most homes. The laser industry continues to increase laser performance metrics, such as average power, pulse energy and peak power. Increases in VAC typically require redesigned AC distribution systems. The circuit branches that distribute power to laser modules are typically housed in a metal box within the laser system. Customers tend to prefer laser systems that take up as little space as possible and that can be serviced quickly. Customers also tend to prefer less expensive laser systems that meet their needs. Therefore, there is a need for laser power distribution modules that enhance system serviceability and space efficiency, while reducing product development costs.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
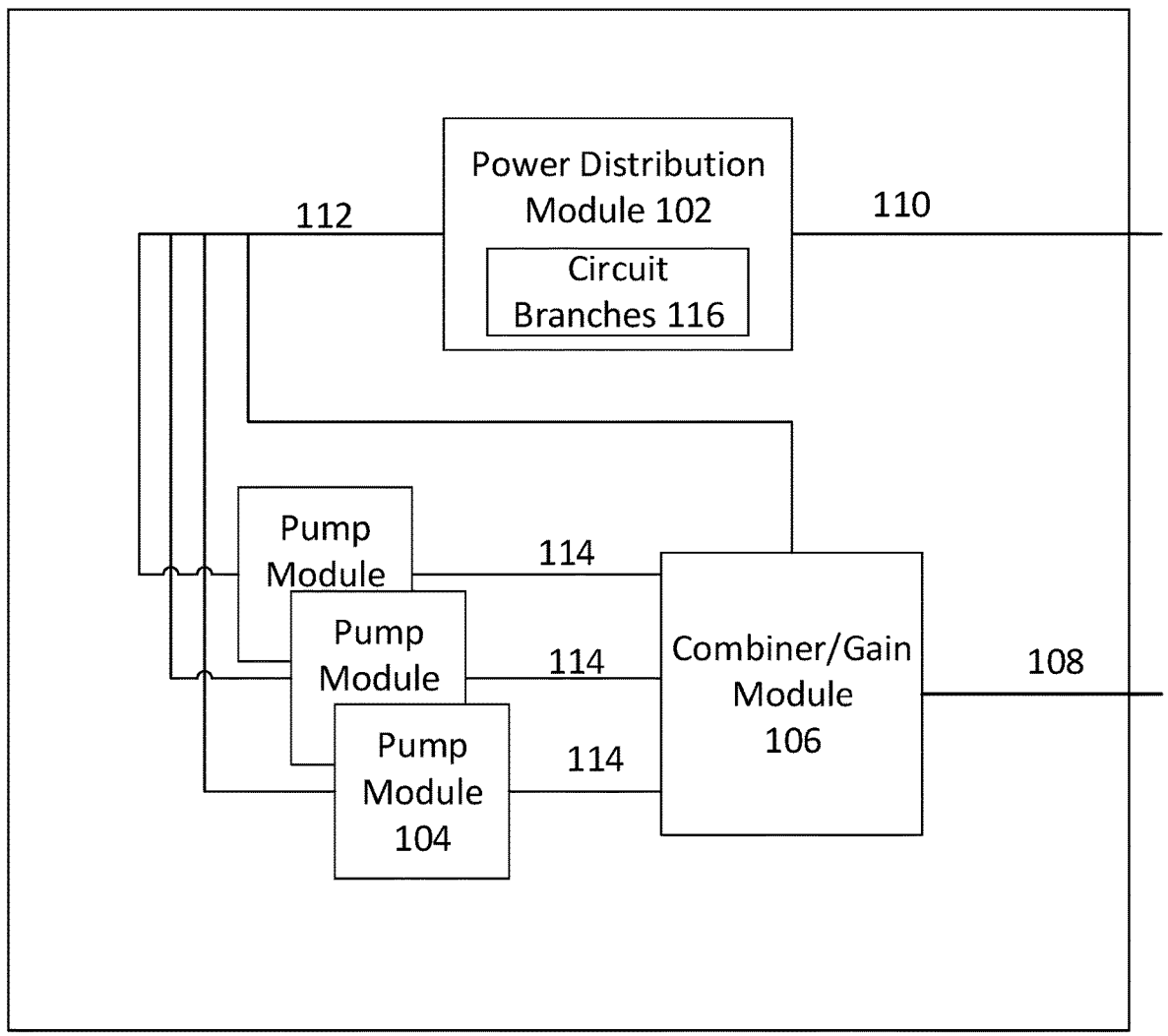
FIG. 1 is a block diagram of an example laser system, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

A laser system generally includes a rack with a plurality of laser modules mounted in the rack to drive light through an optical fiber exiting the system. A power distribution module is generally also included in the rack to distribute electricity through circuit branches coupled to the laser modules. In some embodiments described hereinafter, the rack may include a horizontal cross-member with a bottom rack flange extending vertically and defining a bottom of an opening in the rack. In some embodiments described hereinafter, the power distribution module may include an enclosure disposed in the rack opening, wherein a face of the enclosure including a bottom lip to engage an edge of the bottom rack flange as a fulcrum point over a range to allow the enclosure to pivot between first and second pivot angles relative to the rack. Also, in some embodiments, one or more rails may be mounted within the enclosure, and one or more circuit components associated with each circuit branch may include a rail-mount by which the component is affixed to the one or more rails.

Some benefits of the laser power distribution module described hereinafter include, but are not limited to, enhanced reusability, manufacturability, serviceability, and expandability. In other words, the same power distribution module enclosure with internal standard metal rails for component attachment can be used to house the components necessary to power many different laser systems in terms of maximum average power, maximum peak power, power tunability, power variation, modulation frequency, rise/fall times, beam quality, wavelength, operating voltage and operating voltage frequency. This can lead to reduced design time by allowing the same power distribution module enclosure to be reused among various product lines. Additionally, the use of standard metal rails can improve the assembly process in terms of speed and quality. Components can be aligned and mounted much quicker and more reliably compared with attempting to line up screw holes and attaching components with screws. Serviceability can be enhanced with the power distribution module described hereinafter by features that allow a technician/installer to pivot the power distribution module while it is being supported by the rack. This can allow access to those laser modules mounted low or at the bottom of a rack. Efficient use of space within the power distribution module enclosure can also leave room for larger and/or a higher number of components in the future as power needs increase.

A block diagram of an example laser system that may benefit from incorporating embodiments of the present invention is depicted in FIG. 1. As shown, laser system 100 includes power distribution module 102, pump modules 104, combiner/gain module 106, exit fiber 108, AC input 110, AC output 112, optical fibers 114, and circuit branches 116. Different and/or additional modules may be included in laser system 100 without deviated from the scope of the present invention. For example, separate or multiple combiner/gain modules may be used. Also, any number of pump modules 104 may be present. In one embodiment, six pump modules are included in laser system 100. Laser system 100 may be a direct diode laser system, a fiber laser system, or any other type of laser system that may benefit from incorporating embodiments of the present invention.

Power distribution module 102 may distribute power in the form of AC Voltage received as AC input 110 to pump modules 104 and combiner/gain module 106 through AC output 112. Circuit branches 116 within power distribution module 102 may include circuit components to branch AC input 110 into multiple independent AC outputs 112. In some embodiments, AC input 110 is 3 phase AC which is distributed through circuit branches 116 as single phase AC outputs 112.

Circuit branches 116 may include a circuit breaker, a contactor, a line filter, and/or a terminal block for each AC output 112. The components of circuit branches 116 may be chosen based on the voltage and current requirements of modules 104 and 106. In one embodiment, each of AC outputs 112 provide 480 VAC, though the present invention is not so limited. In some embodiments, AC output 112 may vary by module. For example, AC output 112 may deliver a different voltage or a same voltage at a different amperage to pump module 104 than AC output 112 delivers to combiner/gain module 106.

Circuit branches 116 may be designed to protect modules coupled with AC outputs 112 from damage caused by overcurrent or overload or short circuit. Circuit branches 116 may interrupt current flow through one or more of AC outputs 112 after protective relays detect a fault. Circuit branches 116 may be manually or automatically resettable after a fault. Additionally, circuit branches 116 may attenuate conducted electromagnetic interference (EMI) from AC input 110 to AC outputs 112. Circuit branches 116 may be controlled by software or firmware either internal to or external from laser system 100.

One or more pump modules 104 may be included in laser system 100 to drive light through optical fibers 114. In some embodiments, each of pump module 104 may include a DC power supply to convert AC output 112 into direct current that powers laser diodes. In some embodiments, each of pump module 104 includes one or more liquid-cooled coldplate(s) for heat dissipation.

Combiner/gain module 106 may include coiled fiber to increase light output and may combine optical fibers 114 into a single exit fiber 108 that exits laser system 100. Additional modules (not shown) may be included in laser system 100 to control and/or condition the light driven through exit fiber 108 when laser system 100 is operating. Exit fiber 108 may have any diameter and length. In one embodiment, exit fiber 108 is up to 75 feet in length. Additionally, in some embodiments exit fiber 108 may be single clad while in some embodiments exit fiber 108 may be double clad.

Figure 2:
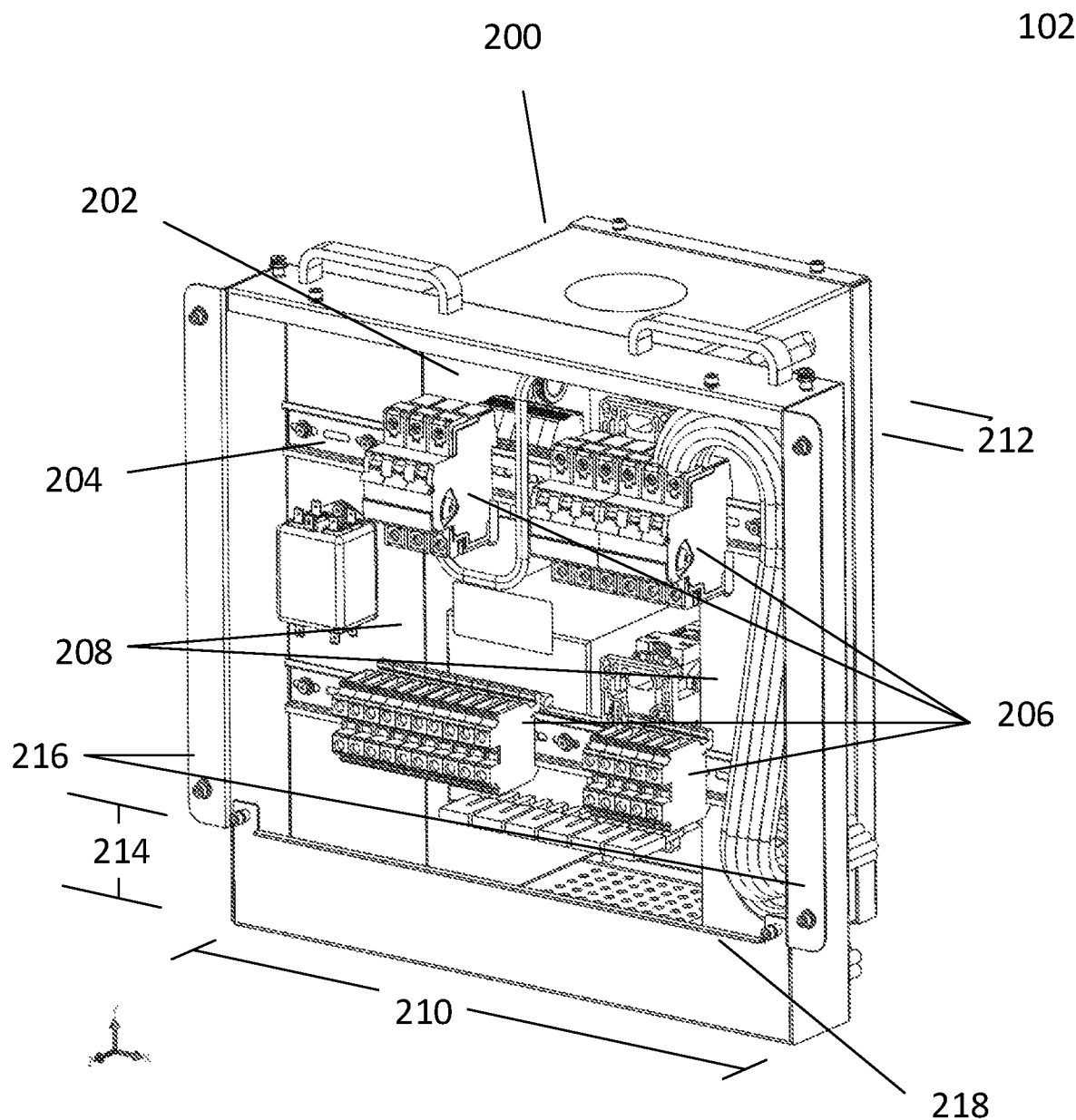
FIG. 2 is a cutaway drawing of an example power distribution module from one side, in accordance with some embodiments.
Figure 3:
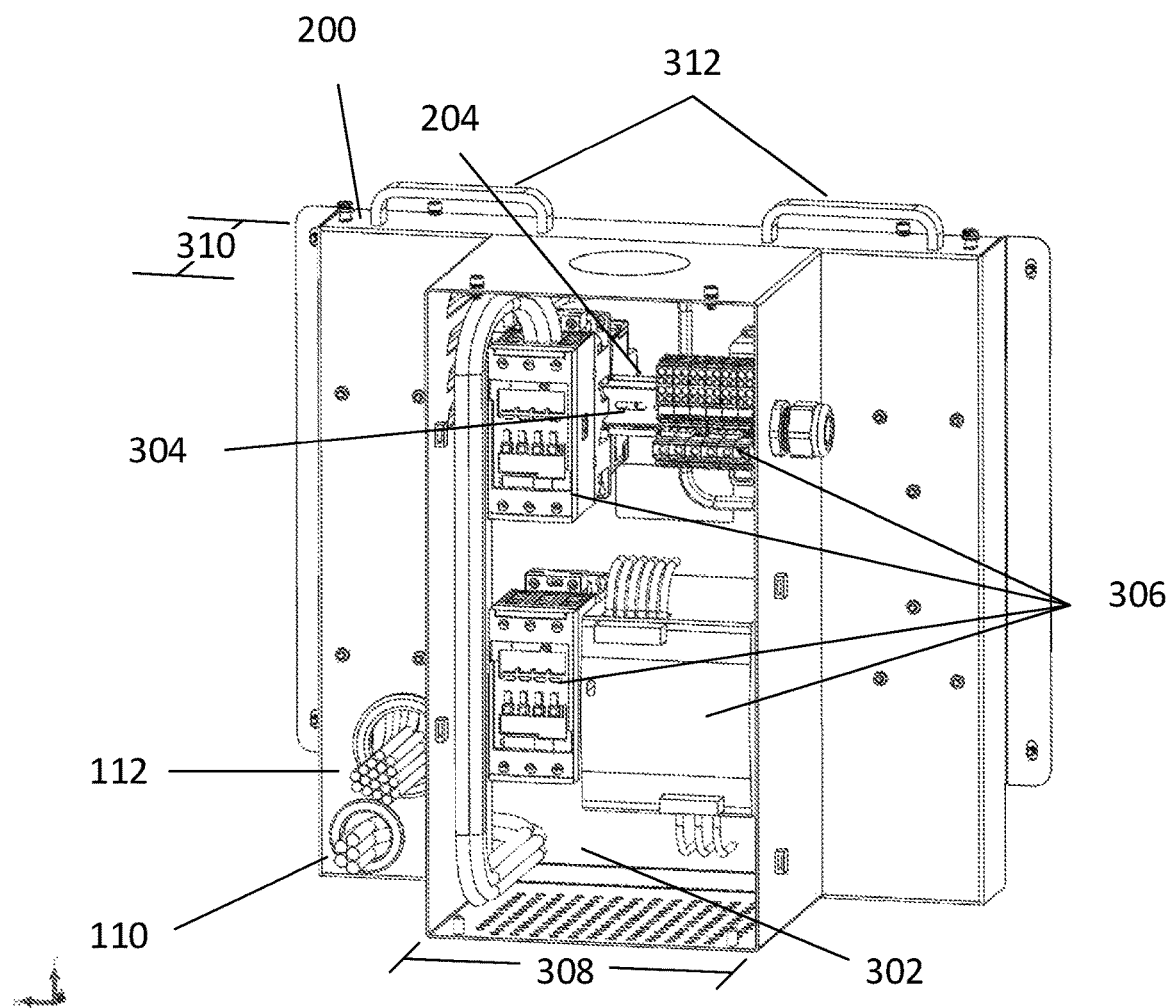
FIG. 3 is a cutaway drawing of an example power distribution module from another side, in accordance with some embodiments.

FIGS. 2 and 3 are cutaway drawings of an example power distribution module from different sides, in accordance with some embodiments. Power distribution module 102 may comprise an enclosure 200 which may include AC input 110, AC output 112, front interior volume 202, front rail 204, front components 206, front volume panels 208, front volume width 210, front volume depth 212, lip distance 214, side lips 216, bottom lip 218, back interior volume 302, back rail 304, back components 306, back volume width 308, back volume depth 310, and handles 312, as shown.

Front components 206 and back components 306 may form circuit branches 116 to distribute AC input 110 to AC output 112. Front components 206 and back components 306 may include circuit breakers, contactors, line filters and terminal blocks. Front components 206 may be affixed to one or more of front rail(s) 204 mounted within enclosure 200, while back components 306 may be affixed to one or more of back rail(s) 304 mounted within enclosure 200.

Front components 206 may include components that would benefit from being more accessible from outside laser system 100. For example, manually resettable circuit breakers may be included in front components 206 since, as shown in more detail hereinafter, front components 206 will be closer to the exterior of laser system 100 while back components 306 will be closer to the interior of laser system 100.

Front components 206 and/or back components 306 may include circuit breakers to detect a fault and interrupt current flowing along one or more of AC outputs 112. Appropriate circuit breakers for use in power distribution module 102 may be arranged with protective relay pilot devices to sense a fault condition and to operate the trip opening mechanism. Such circuit breakers may be energized by a separate power source or may be self-contained along with current transformers and an internal control power source. The circuit breakers may be one, two, three, or four pole and may be magnetic circuit breakers, thermal magnetic circuit breakers, common trip breakers, or medium-voltage circuit breakers.

Front components 206 and/or back components 306 may include contactors for switching power on and off to one or more of AC outputs 112. The contactors incorporated may be controlled by software, firmware, or other inputs such as toggles or buttons. Appropriate contactors for use in power distribution module 102 may be multi-pole and multi-throw or single-pole and single-throw.

Front components 206 and/or back components 306 may include line filters to attenuate EMI on AC input 110. Appropriate line filters for use in power distribution module 102 may be able to attenuate in common mode or differential mode either passively or actively.

Front components 206 and/or back components 306 may include terminal blocks to connect electrical wires. Appropriate terminal blocks for use in power distribution module 102 may include clamping plates to hold wires in place with tightening screws.

AC input 110 and AC output 112 may be provided in the form of a collection of cables. In one embodiment AC input 110 includes a collection of 6 gauge shielded wires. In one embodiment, AC output 112 includes a collection of 8 gauge shielded wires. In some embodiments, the number of shielded wires in AC output 112 is greater than or equal to the number of laser modules included in laser system 100. In some embodiments, AC input 110 and AC output 112 are three phase AC voltage.

Enclosure 200 may include front interior volume 202 and back interior volume 302 of differing dimensions. Front interior volume 202 may have a front volume width 210 that is orthogonal to a front volume depth 212. Similarly, back interior volume 302 may have a back volume width 308 that is orthogonal to a back volume depth 310. In one embodiment, front volume width 210 is greater than back volume width 308, while back volume depth 310 is greater than front volume depth 212. One skilled in the art would appreciate that a dual-cuboid shape to enclosure 200 created by front interior volume 202 and back interior volume 302 may facilitate efficient use of space in a rear compartment of a system rack design by allowing front interior volume 202 to stay near the outside of the system rack, while the narrower and deeper back interior volume 302 protrudes further into the system rack.

Front rail 204 and back rail 304 may bifurcate, or span an interface between, front interior volume 202 and back interior volume 302. Front rail 204 may have a length slightly less than front volume width 210 and may have end portions mounted (for example with screws) to front volume panels 208. Back rail 304 may have a length slightly less than back volume width 308 and may be mounted (for example with screws) to a center portion of front rail 204. While shown as being mounted horizontally, front rail 204 and back rail 304 may be mounted vertically or may comprise both horizontal and vertical rails. Also, while shown as including two front rails 204 and two back rails 304, any number of front rails 204 and back rails 304 may be used.

Front components 206 and back components 306 may be placed on front rail 204 or back rail 304 based in part on their width or depth. In one embodiment, one or more of back components 306, affixed to back rail 304, have a depth greater than front volume depth 212 but less than back volume depth 310. In one embodiment, front components 206 include a plurality of circuit breakers affixed to front rail 204 and back components 306 include a plurality of contactors affixed to back rail 304. In one embodiment, a back component 306, affixed to back rail 304, includes a DC power supply, having a depth greater than front volume depth 212, electrically coupled with additional back components 306 (for example contactors). In some embodiments, a DC power supply may be 24V and may provide power through an opening in enclosure 200 to additional auxiliary elements of laser system 100, for example LED lights, sensors, fans, pumps or other system level electrical parts that don't require a high voltage AC.

Figure 4:
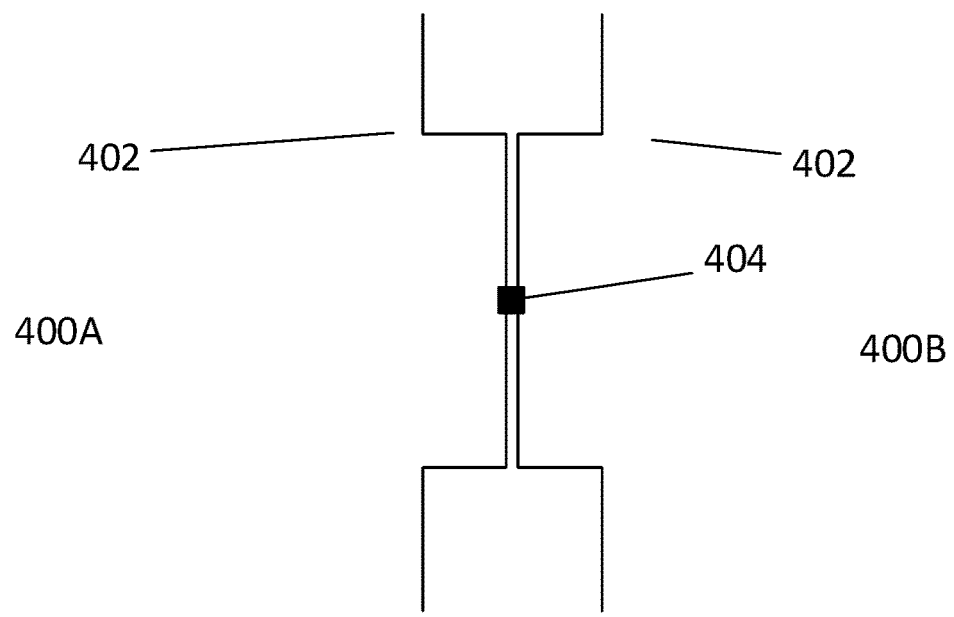
FIG. 4 is a drawing of an example rail, in accordance with some embodiments.

FIG. 4 is a drawing of example rails, in accordance with some embodiments. Rails 400A and 400B may be standard metal rails and may have matching bend profiles 402. In one embodiment, bend profile 402 comprises a top hat standard. In one embodiment, rails 400A and 400B comply with a DIN standard. The back of rail 400A may be facing (or even touching) the back of rail 400B. Rails 400A and 400B may be coupled to each other with one or more fastener(s) 404 (for example a screw). In some embodiments, rails 400A and 400B represent a cross-section of front rail 204 and back rail 304 in enclosure 200. In some embodiments, rails 204 and 304 are 35 mm wide and 15 mm deep. In some embodiments, rails 204 and 304 are 7.5 mm deep. While shown as both being top hat, sometimes referred to as Type O or Type Omega rails, rail 204 and rail 304 may be other types of rail and may differ from each other. For example, rail 204 may be a top hat rail section and rail 304 may be a C section rail or vice versa. Similarly, rail 204 may be a G type rail section in some embodiments. Also, miniature or extra-wide rail sections may be utilized in some embodiments.

One skilled in the art would recognize that the use of quick attach rails can enable fast and easy interchangeability of components, thereby reducing both manufacturing time (and thereby cost), but also time and cost associated with servicing systems that require component replacement. From a design perspective, the use of rails (such as front rail 204 and back rail 304) in power distribution module 100 can lead to adoption of a single enclosure 200 for multiple product lines. Provided there is adequate length of rail and depth of enclosure interior, various component quantities and ratings can be incorporated as needed.

Figure 5:
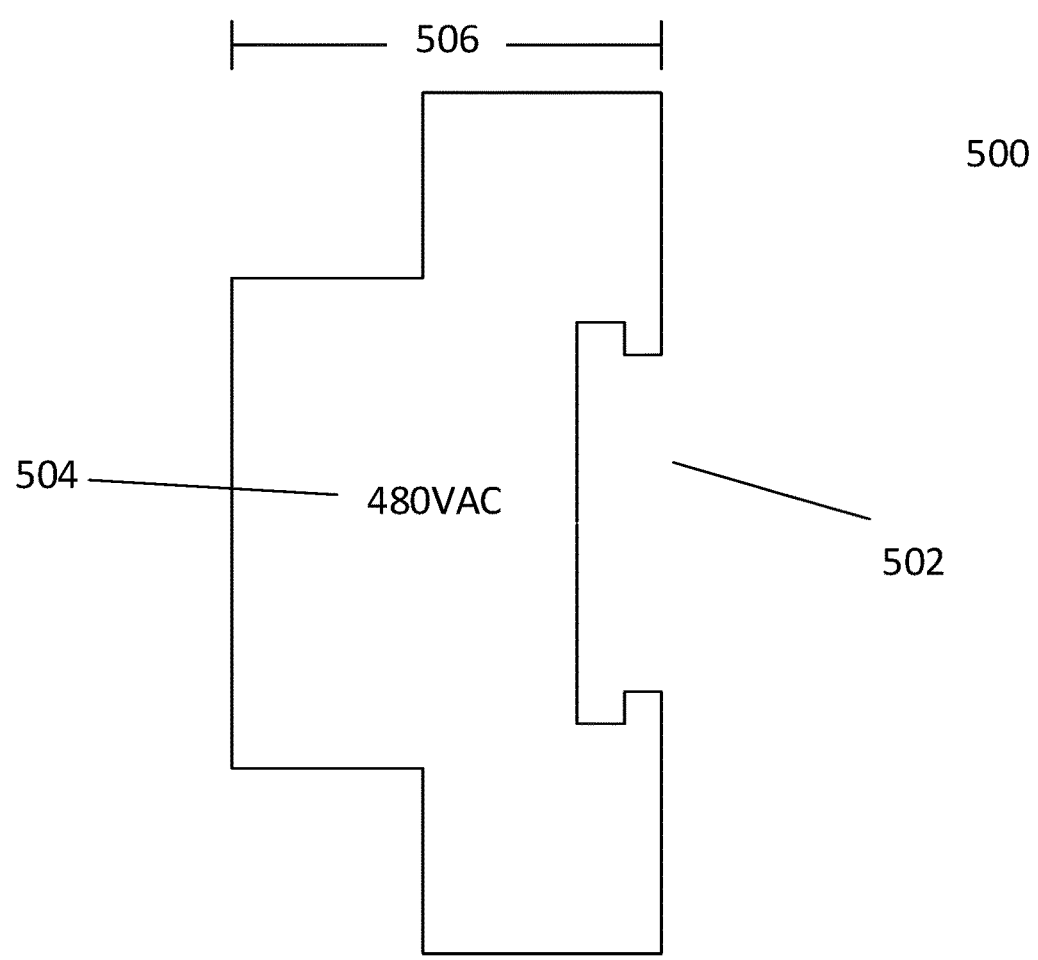
FIG. 5 is a drawing of an example component, in accordance with some embodiments.

FIG. 5 is a drawing of an example component, in accordance with some embodiments. In some embodiments, component 500 may represent front components 206 or back components 306. Component 500 may include a rail-mount 502. In one embodiment, rail-mount 502 enables component 500 to be affixed to a standard metal rail (for example rails 400A, 400B, 204 and 304). In one embodiment, rail-mount 502 complies with a DIN standard. Component 500 may have a rating 504 that defines its operating capacity. While shown as having a rating 504 of 480 VAC, the present invention is not so limited. Component 500 may have a depth 506 that may be considered when determining where to affix component 500 within enclosure 200. Components 500 that have a rating 504 of handling 380 VAC, for example, may have a significantly shallower depth 506 than components 500 that have a rating 504 of 480 VAC.

While not shown for simplicity, rail-mount 502 may include additional parts or features. For example, rail-mount 502 may be spring loaded with a lever that expands the opening of rail-mount 502 when component 500 is being added to or removed from the bends of a rail (for example rail 400A), and which contracts rail-mount 502 when the lever is not pressed. In other embodiments a screw adjustment or plastic clips may be present to expand or contract rail-mount 502. In some embodiments, component 500 is UL certified.

Figure 6:
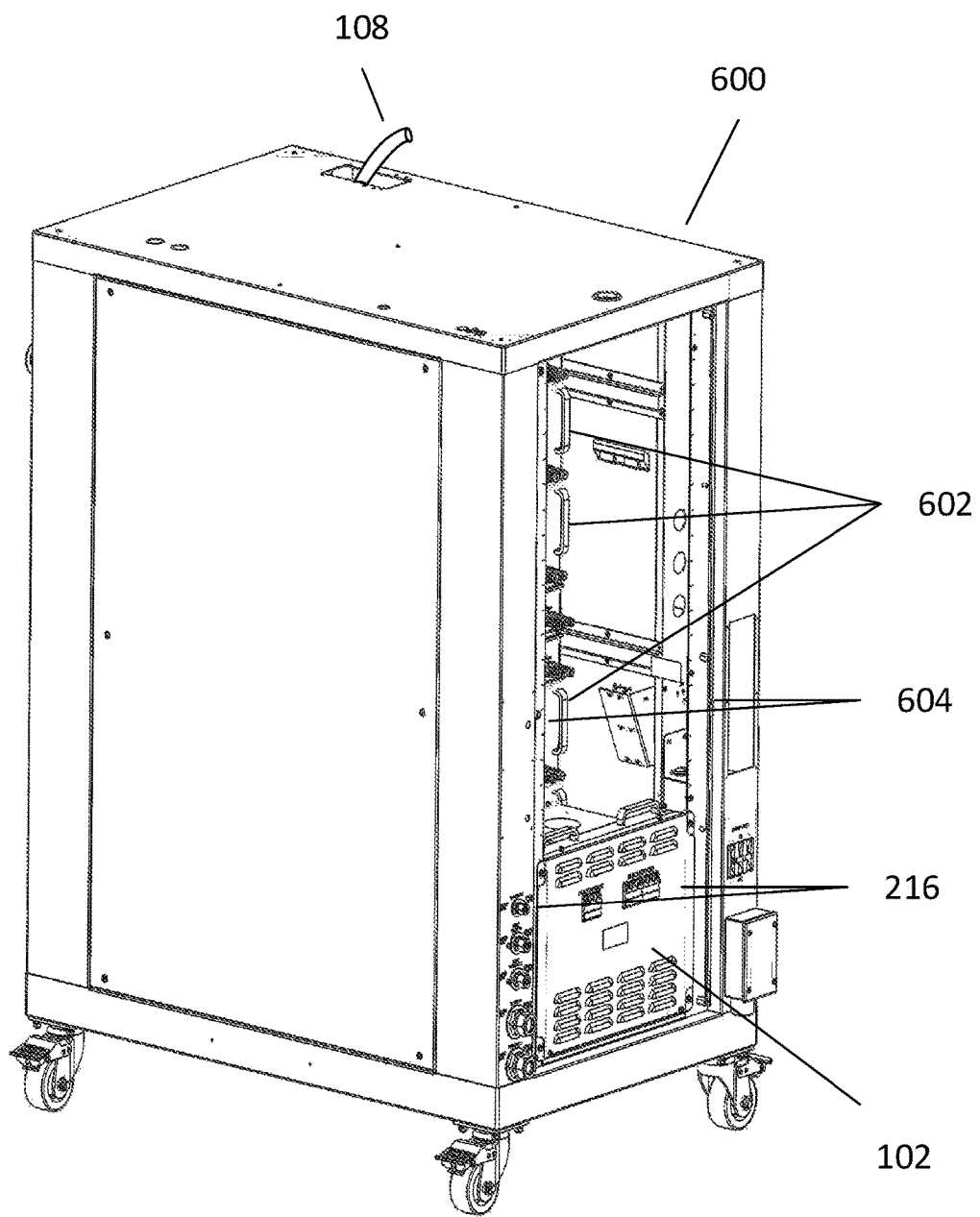
FIG. 6 is a 3D drawing of an example laser system, in accordance with some embodiments.

Turning now to FIG. 6, a 3D drawing of an example laser system, in accordance with some embodiments, is shown. Laser system 100 may include rack 600, power distribution module 102, exit fiber 108, laser modules 602, side lips 216, and struts 604. Rack 600 may provide the structure and mounting points for supporting and containing the various modules of laser system 100. Rack 600 may be of standard or non-standard dimensions. Rack 600 may include additional elements not shown or may be implemented without all elements shown (for example wheels).

In some embodiments, rack 600 includes a 23-inch standardized rack frame for mounting laser modules 602. In some embodiments, rack 600 includes a 19-in standardized rack frame. In other embodiments, different rack widths may be used. In some embodiments the height of rack 600 is standardized in multiples of 1.752 inches or one rack unit or U. In one embodiment, rack 600 is 28 U tall. In other embodiments different rack heights may be used. In some embodiments, rack 600 is a four vertical post rack that allows for mounting rails to support laser modules 602 at the front and rear. In other embodiments, rack 600 is a two vertical post rack. In some embodiments, rack 600 is open in construction, while in other embodiments rack 600 is enclosed, for example by doors, side panels and a top.

Rack 600 may have provisions for airflow and cooling of laser modules 602. In some embodiments, front and/or side air intakes are included as well as rear exhaust. Forced air fan cooling may or may not be included. In some embodiments, water cooling is provided to each of laser modules 602 in the form of cold plates supported by hoses, pumps, water inlets, water outlets, and drains.

Power distribution module 102 and laser modules 602 (which may include pump module 104 and combiner/gain module 106) are mounted within rack 600. Side lips 216 of enclosure 200 may interface with struts 604, which may extend vertically and define sides of an opening within rack 600. Fastener holes may be included in side lips 216 and struts 604 to fasten power distribution module 102 within rack 600.

Exit fiber 108 may exit laser system 100 through an opening in rack 600. Exit fiber 108 may include many feet of optical fiber to interface with external tools (not shown).

Figure 7:
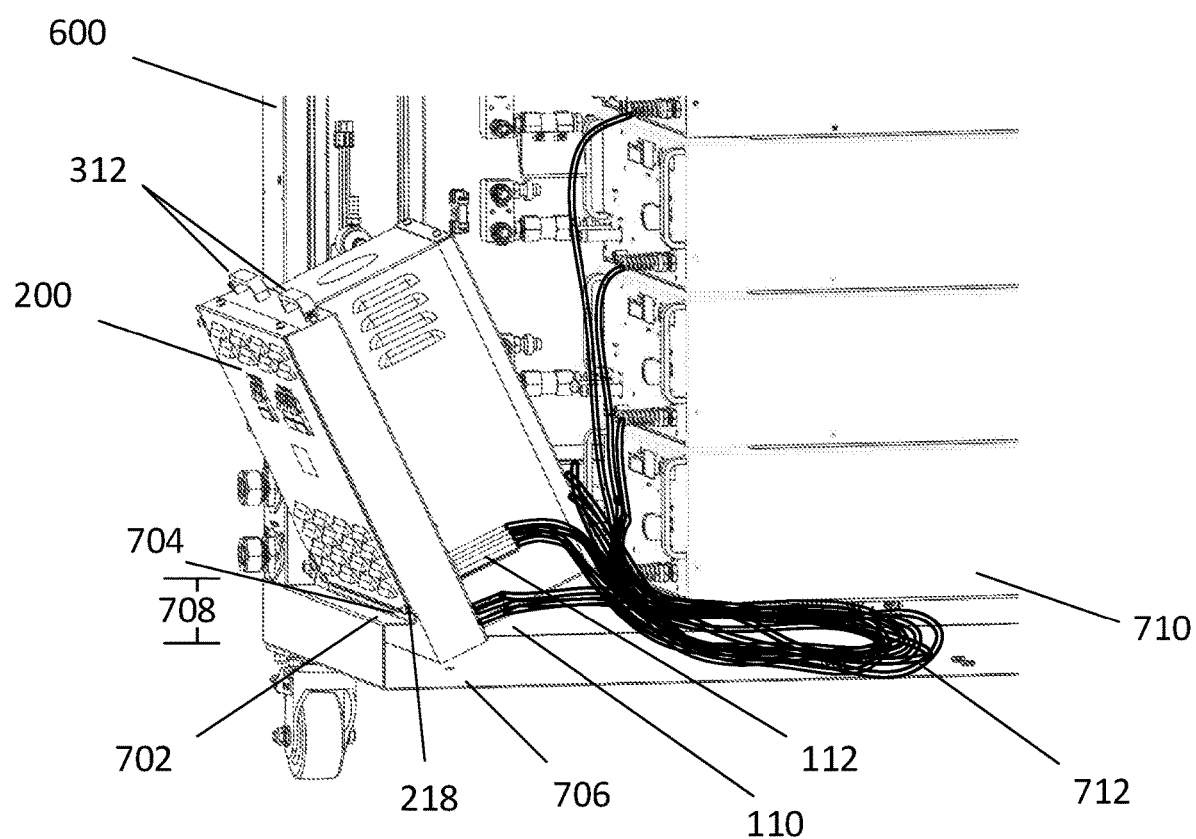
FIG. 7 is a 3D drawing of a power distribution module in an opening of a laser system rack, in accordance with some embodiments.

FIG. 7 is a 3D drawing of a power distribution module in an opening of a laser system rack, in accordance with some embodiments. As shown, laser system 100 may include rack 600, cross-member 702, flange 704, bottom panel 706, cross-member height 708, enclosure 200, bottom lip 218, handles 312, AC input 110, AC output 112, bottom module 710, and service loops 712.

Flange 704 may extend vertically from horizontal cross-member 702 and may define a bottom of an opening in rack 600. Bottom lip 218 of enclosure 200 may engage an edge of flange 704 as a fulcrum point to allow enclosure 200 to pivot. Bottom lip 218 and flange 704 may interlock with each other such that flange 704 occupies space between bottom lip 218 and enclosure 200. Cross-member height 708, or the distance from flange 704 to bottom panel 706, may be greater than lip distance 214, or the distance from bottom lip 218 to a bottom of enclosure 200 (see FIG. 2), such that flange 704 supports the weight of enclosure 200 when fully seated in rack 600.

Figure 8:
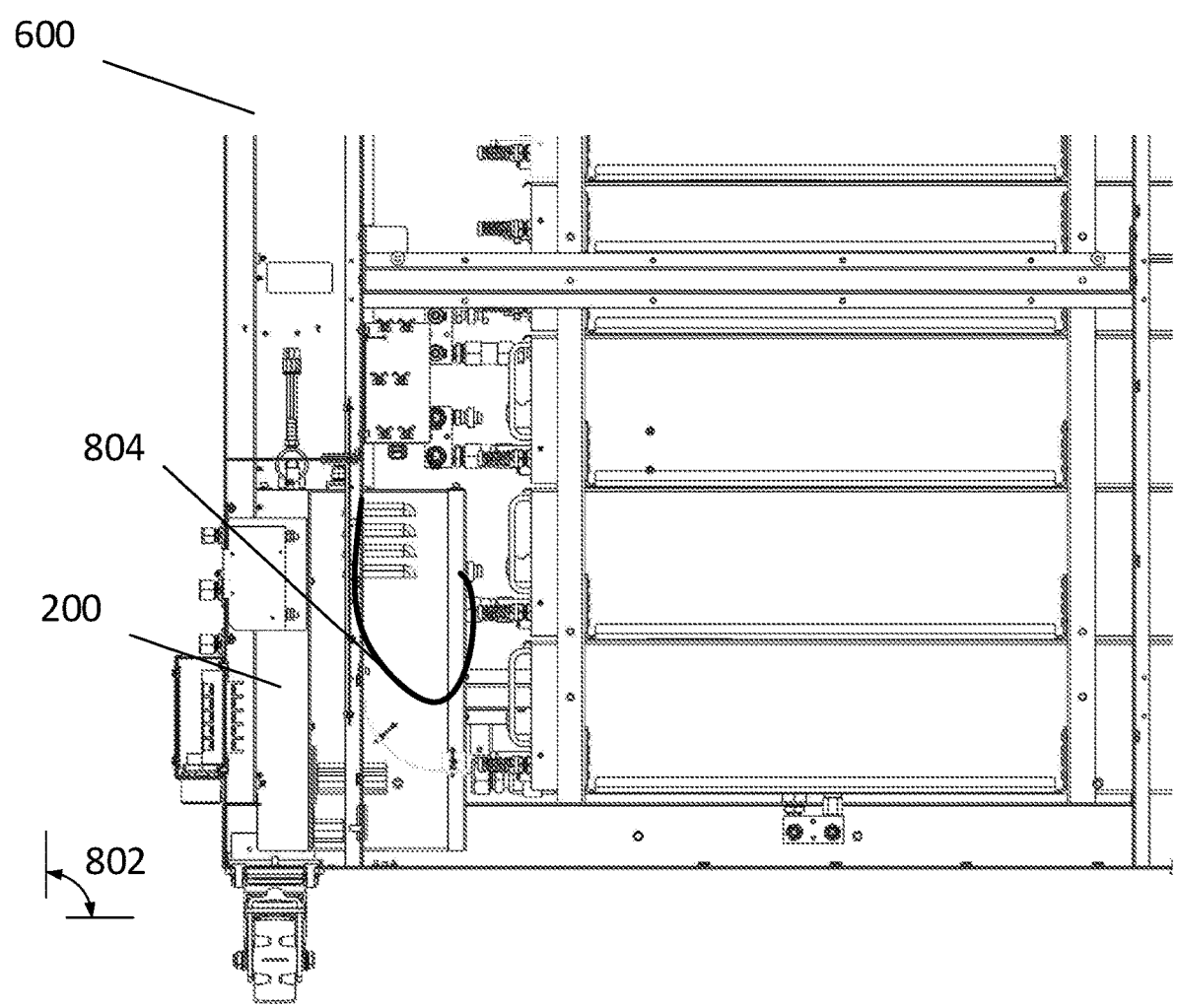
FIG. 8 is a drawing of a power distribution module at a first pivot angle in a laser system rack, in accordance with some embodiments.
Figure 9:
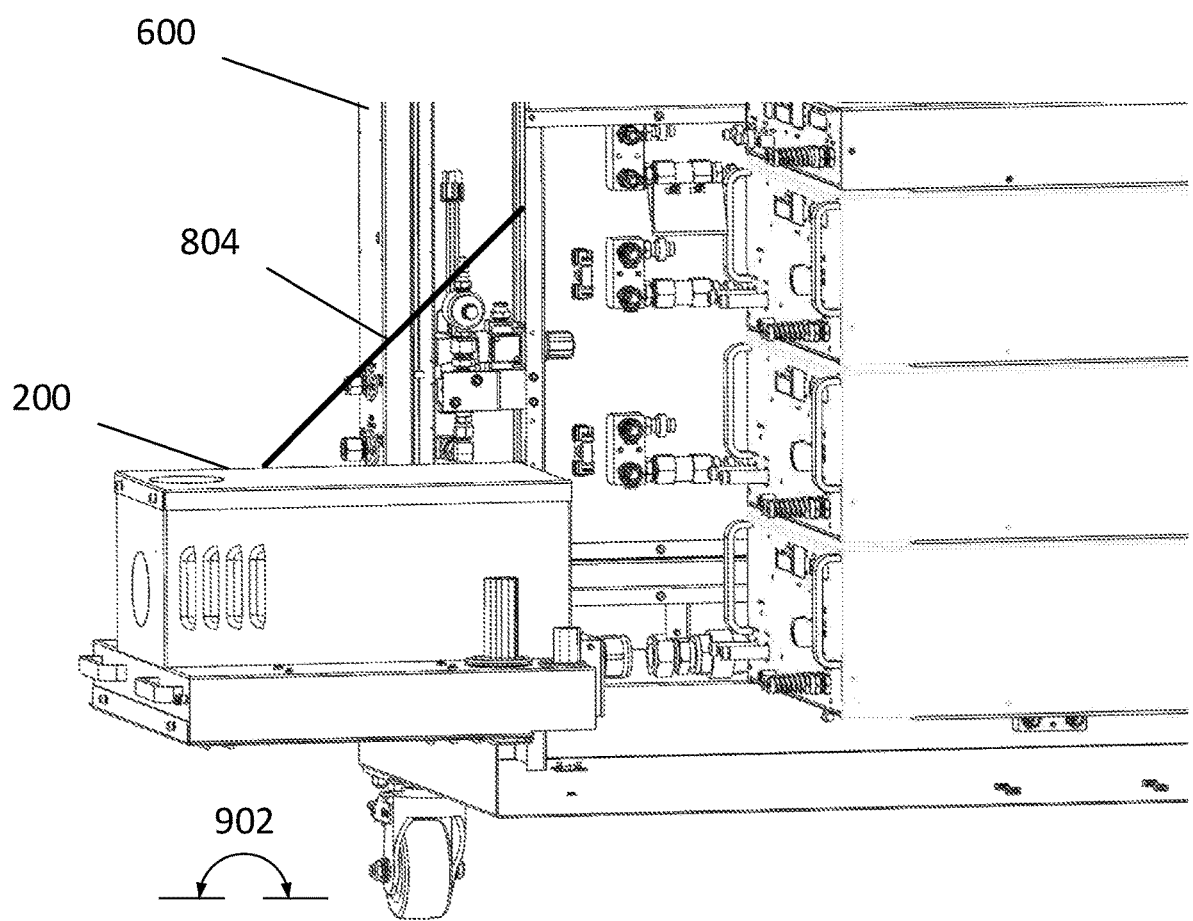
FIG. 9 is a 3D drawing of a power distribution module at a second pivot angle in a laser system rack, in accordance with some embodiments.

The power distribution module enclosure 200 may be able to pivot (for example when a force is applied to handles 312) in a range between a first pivot angle 802 (as depicted in FIG. 8) and a second pivot angle 902 (as depicted in FIG. 9) relative to rack 600. First pivot angle 802 may be approximately 90 degrees, while second pivot angle 902 may be approximately 180 degrees. In some embodiments, first pivot angle 802 represents fully seating of enclosure 200 in rack 600 such that side lips 216 can be fastened to struts 604. One skilled in the art would appreciate that second pivot angle 902 can be beneficial when a technician need to access the interior of rack 600, for example to service bottom module 710. In some embodiments, the engagement between bottom lip 218 and flange 704 is metal-on-metal, however in other embodiments plastic or other material may be included on portions of bottom lip 218 and/or flange 704 to reduce friction or eliminate sharp edges.

In some embodiments, support chain 804 is coupled to rack 600 and enclosure 200. Support chain 804 may be slack when enclosure 200 is at first pivot angle 802 (FIG. 8). Support chain 804 may be under tension by a portion of the weight of enclosure 200 not carried by flange 704 at second pivot angle 902 (FIG. 9). In some embodiments, the length of support chain 804 defines the extent of second pivot angle 902. Support chain 804 may be made of metal chain links or cable. In some embodiments, support chain 804 is made of non-metal material, such as synthetic fabric. In some embodiments, support chain 804 includes a second support chain.

Figure 10:
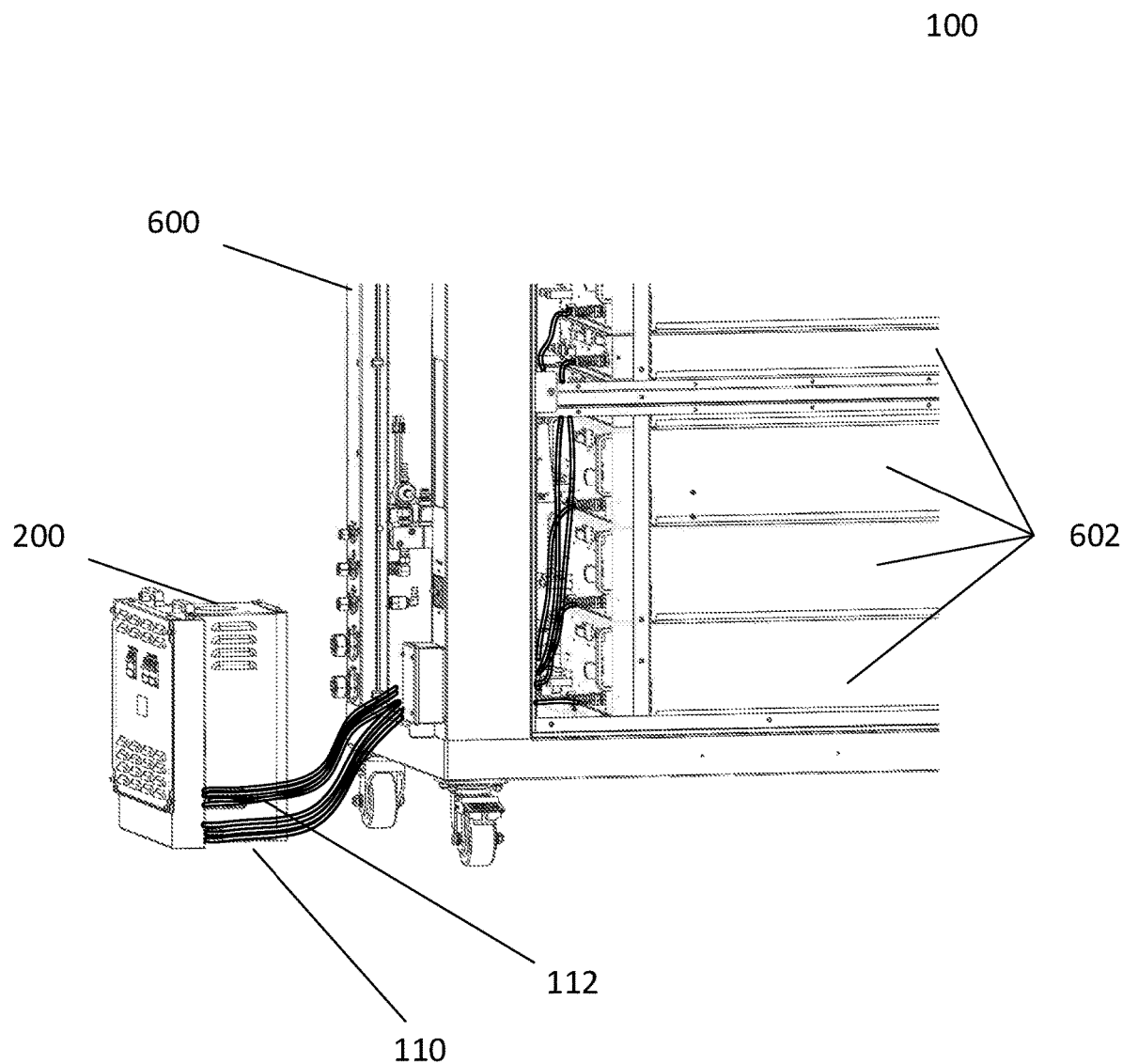
FIG. 10 is a 3D drawing of a power distribution module outside of a laser system rack, in accordance with some embodiments.

Turning back to FIG. 7, the cables that make up AC input 110 and AC output 112 may include sufficient length to form service loops 712 disposed between bottom module 710 and bottom panel 706. Service loops 712 provide sufficient length to maintain electrical connection between the power distribution module and the laser modules 602 even when enclosure 200 is outside of rack 600, as shown in FIG. 10. In some embodiments, service loops 712 include about an extra two feet in length in each cable. In some embodiments, posts or zip-ties or tie-downs are included to arrange and/or contain service loops 712. The cables that make up AC input 110 may electrically couple power distribution module 102 with one or more connectors on a side of rack 600 to receive power through an external cable(s) and power outlet(s). AC input 110 may include separate cables for L1 (black), L2 (red), L3 (blue), Neutral (white) and Ground (green).

Figure 11:
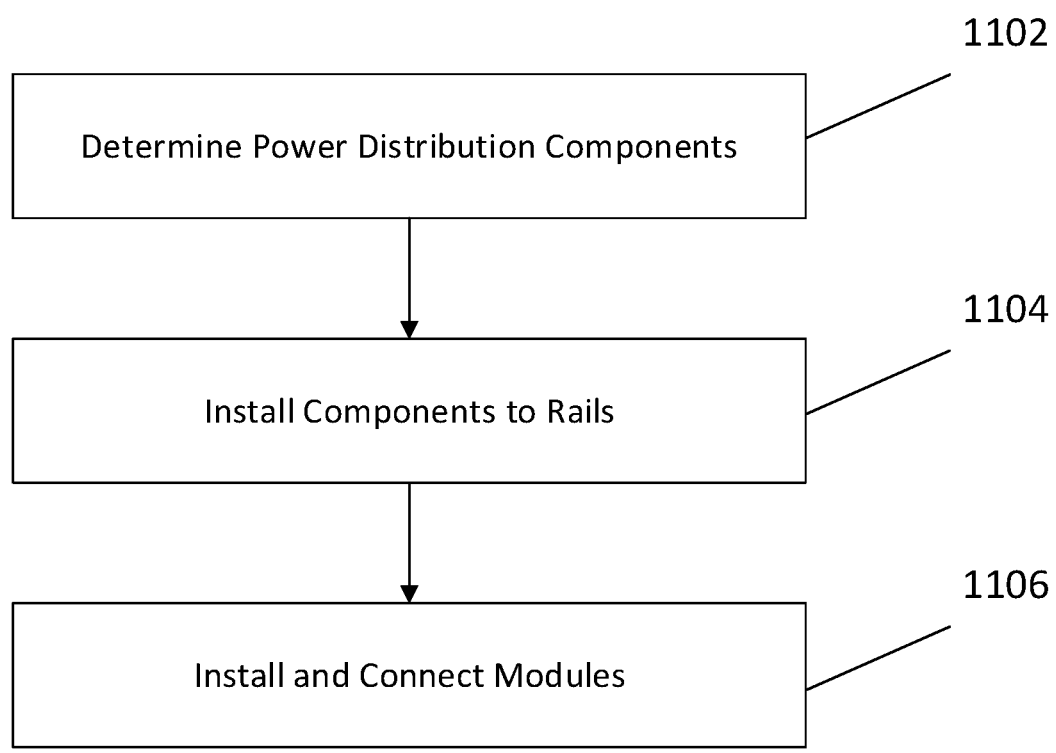
FIG. 11 is a flowchart of an example method, in accordance with some embodiments.

A flowchart of an example method, in accordance with some embodiments, is shown in FIG. 11. The method begins with determining (1102) the power distribution components needed to form circuit branches 116. A laser system 100 may be designed for a specific purpose or customer and may have unique power requirements. Components 500 may be chosen based on a rating 504 to handle specific voltages or currents. Some factors that may influence power distribution component selection decisions may include maximum average power, maximum peak power, power tunability, power variation, modulation frequency, rise/fall times, beam quality, wavelength, operating voltage and operating voltage frequency.

In some embodiments, components needed to form circuit branches 116 may include circuit breakers, line filters, contactors, and/or terminal blocks. The number of components needed may be based on the number of laser modules 602 to be included in laser system 100. For example, in some embodiments, where 6 laser modules 602 are to be included in laser system 100, 6 circuit breakers, line filters, and contactors are included in power distribution module 102.

The method continues with installing (1104) components to rails in enclosure 200. Front components 206 may be mounted to front rail 204 and back components 306 may be mounted to back rail 304 based in part on a component depth 506. The components can be electrically coupled to form circuit branches 116 before or after being mounted to rails within enclosure 200. In one embodiment, a DC power supply, which has a depth greater than front volume depth 212, is mounted to back rail 304. In one embodiment circuit breakers are installed to front rail 204 in part because they may be more easily accessible to a service technician in the event of a fault.

Components used may have internal spring actions, such that a component rail-mount snaps firmly into place on a standard metal rail, such as a DIN rail. In some embodiments, components may include a screw adjustment to hold them in place on the rail. In some embodiments, locations of components on the rails may be chosen to minimize wire routing. For example, line filters and/or circuit breakers may be placed in a location closer to AC inputs 110 since their functionality may be beneficial to subsequent down-stream components.

The method concludes with installing (1106) power distribution module 102 in rack 600 and connecting AC outputs 112 to laser modules 602. Electrical connections may be established to and from power distribution module 102 through AC inputs 110 and AC outputs 112 while enclosure 200 is outside of rack 600. In addition to connecting AC inputs 110 and AC outputs 112 within rack 600, connections may also be made with a DC power supply within enclosure 200 to other elements within rack 600, for example LED lights, sensors, fans, pumps or other system level electrical parts that don't require a high voltage AC.

Excess length of cable of AC inputs 110 and AC outputs 112 may be formed into service loops 712 and disposed between bottom module 710 and bottom panel 706. Handle (s) 312 may be used to lift enclosure 200 into an opening in rack 600 and to place bottom lip 218 into contact with flange 704. Support chain 804 may then be coupled with enclosure 200 and rack 600. Enclosure 200 can then be pivoted to first pivot angle 802, such that side lips 216 are interfacing with struts 604. Screws may then be installed through side lips 216 and struts 604 to secure power distribution module 102 within rack 600.

Portions of this method may be performed in reverse order for disassembly or servicing of laser system 100. For example, to service bottom module 710, enclosure 200 may be pivoted (after removing any screws fastening side lips 216 with struts 604) from first pivot angle 802 to second pivot angle 902. If necessary enclosure 200 can be disconnected from support chain 804 and placed outside of rack 600 while electrical connection is maintained to modules 602 because of the length of cable provided by service loops 712.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It will be recognized that the invention is not limited to the embodiments so described, but can be practiced with modification and alteration without departing from the scope of the appended claims. The above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A laser system, comprising:
a rack;
a plurality of laser modules mounted in the rack to drive light through an optical fiber exiting the system; and
a power distribution module disposed within the rack to distribute input electricity through circuit branches coupled to the laser modules, wherein the power distribution module comprises:
an enclosure;
a first rail and a second rail mounted within the enclosure, the first rail and the second rail bifurcating an interior volume of the enclosure into front and back volumes; and
a plurality of circuit components associated with the circuit branches and disposed within the enclosure, the plurality of circuit components comprising a first component mounted to the first rail and occupying a portion of the front volume and a second component mounted to the second rail and occupying a portion of the back volume, and wherein each of the first and second components include a rail-mount by which the circuit component is affixed to a respective one of the rails.

2. The system of claim 1, wherein:
the first and second rails have a same bend profile;
a back of the first rail faces a back of the second rail; and
the first and second circuit components have a same standard-compliant rail-mount.

3. The system of claim 2, wherein the rails comprise DIN-compliant rails and the bend profile comprises a top hat.

4. The system of claim 2, wherein:
end portions of the first rail are mounted to first and second panels of the enclosure;
the second rail is mounted to a center portion of the first rail;
the front volume has a front width at least equal to the length of the first rail; and
the back volume has a back width at least equal to the length of the second rail.

5. The system of claim 4, wherein the back width is smaller than the front width.

6. The system of claim 5, wherein:
the front volume has a front depth orthogonal to the front width;
the back volume has a back depth, greater than the front depth; and
the one or more circuit components further comprise a circuit component affixed to the second rail that has a depth greater than the front depth, but less than the back depth.

7. The system of claim 1, wherein the circuit components are selected from the group consisting of: circuit breakers, terminal blocks, line filters, and contactors.

8. The system of claim 7, wherein:
the front volume has a front depth orthogonal to the front width;
the back volume has a back depth, greater than the front depth; and
the one or more circuit components further comprise:
a plurality of circuit breakers affixed to the first rail; and
a plurality of contactors affixed to the second rail.

9. The system of claim 8, wherein the power distribution module further comprises a DC power supply coupled to power each of the contactors and affixed to the second rail to occupy a portion of the back volume.

10. A laser system, comprising:
a rack including a horizontal cross-member with a bottom rack flange extending vertically and defining a bottom of an opening in the rack;
a plurality of laser modules mounted in the rack to drive light through an optical fiber exiting the system;
a power distribution module to distribute input electricity to the modules, wherein the power distribution module comprises an enclosure disposed in the rack opening, a face of the enclosure including a bottom lip to engage an edge of the bottom rack flange as a fulcrum point over a range to allow the enclosure to pivot between first and second pivot angles relative to the rack; and
a plurality of electrical cables coupling the power distribution module to the laser modules, wherein each of the plurality of electrical cables includes a service loop of sufficient length to maintain an electrical connection between the laser modules and the distribution module while the bottom lip is disengaged from the bottom rack flange.

11. The system of claim 10, wherein:
the rack includes struts extending vertically and defining sides of the rack opening;
the enclosure face further includes a first and second side lip to interface with the struts at the first pivot angle; and
a distance between the bottom lip and a bottom of the enclosure is less than a distance between the edge of the bottom rack flange and a bottom panel of the rack so that the flange supports the weight of the enclosure while at the first pivot angle.

12. The system of claim 11, wherein:
the rack includes a support chain coupled to the enclosure and the rack;
a length of the support chain defines the second pivot angle; and
the support chain is to be placed under tension by a portion of the enclosure weight not carried by the flange while at the second pivot angle.

13. The system claim 10, wherein the service loop is disposed between a bottom module and a bottom panel of the rack while the enclosure is at the first pivot angle.

14. The system of claim 10, wherein the enclosure includes one or more handles attached to a side of the enclosure opposite the lip through which a force may be applied to pivot the enclosure about the fulcrum.

15. A laser system, comprising:
a rack including a horizontal cross-member with a bottom rack flange extending vertically and defining a bottom of an opening in the rack;
a plurality of laser modules mounted in the rack to drive light through an optical fiber exiting the system;
a power distribution module to distribute input electricity through circuit branches coupled to the laser modules, wherein the power distribution module comprises:
an enclosure disposed in the rack opening,
a face of the enclosure including a bottom lip to engage an edge of the bottom rack flange as a fulcrum point over a range to allow the enclosure to pivot between first and second pivot angles relative to the rack,
one or more rails mounted within the enclosure, and
one or more circuit components associated with each circuit branch disposed within the enclosure, each of the components including a rail-mount by which the component is affixed to the one or more rails; and
a plurality of electrical cables coupling the power distribution module to the laser modules.

16. The system of claim 15, wherein:
the one or more rails further comprises:
a first and second rail bifurcating an interior volume of the enclosure into front and back volumes; and
the one or more components further comprise:
a first component mounted to the first rail and occupying a portion of the front volume; and
a second component mounted to the second rail and occupying a portion the back volume.

17. The system of claim 16, wherein:
the first and second rails have a same bend profile;
a back of the first rail faces a back of the second rail; and
the first and second components have a same standard-compliant rail-mount.

18. The system of claim 15, wherein the cables each include a service loop of sufficient length to maintain an electrical connection between the laser modules and distribution module while the lip is disengaged from the flange.

* * * * *